(12) United States Patent
Wang

(10) Patent No.: US 10,861,147 B2
(45) Date of Patent: Dec. 8, 2020

(54) STRUCTURAL HEALTH MONITORING EMPLOYING PHYSICS MODELS

(71) Applicant: Sikorsky Aircraft Corporation, Stratford, CT (US)

(72) Inventor: Hongcheng Wang, Farmington, CT (US)

(73) Assignee: Sikorsky Aircraft Corporation, Stratford, CT (US)

(*) Notice: Subject to any disclaimer, the term of this patent is extended or adjusted under 35 U.S.C. 154(b) by 0 days.

(21) Appl. No.: 15/542,358

(22) PCT Filed: Jan. 12, 2016

(86) PCT No.: PCT/US2016/012959
§ 371 (c)(1),
(2) Date: Jul. 7, 2017

(87) PCT Pub. No.: WO2016/115075
PCT Pub. Date: Jul. 21, 2016

(65) Prior Publication Data
US 2018/0276810 A1    Sep. 27, 2018

Related U.S. Application Data

(60) Provisional application No. 62/102,634, filed on Jan. 13, 2015.

(51) Int. Cl.
*G06T 9/00*         (2006.01)
*G06T 7/00*         (2017.01)
(Continued)

(52) U.S. Cl.
CPC .............. *G06T 7/0008* (2013.01); *B64F 5/60* (2017.01); *G01B 11/24* (2013.01);
(Continued)

(58) Field of Classification Search
CPC ......... G06T 7/0008; G06T 2207/20076; G06T 2207/20221; G06T 2207/10016;
(Continued)

(56) References Cited

U.S. PATENT DOCUMENTS 4,680,470 A    7/1987  Heald
4,752,140 A    6/1988  Cielo et al.
(Continued)

OTHER PUBLICATIONS

B. Shahraray et al Defect detection, classification and quantification in optical fiber connectors. In (IAPR Workshop on Machine Vision Applications), pp. 1-22, 1990. 2.
(Continued)

*Primary Examiner* — Amir Alavi
(74) *Attorney, Agent, or Firm* — Baker Botts L.L.P.

(57) ABSTRACT

A method for detecting structural defects includes generating a first probabilistic map of a critical location of a structural component based on a physics model of the critical location, capturing data of the critical location, generating a second probabilistic map based on an analysis of the captured data of the critical location, aligning the first probabilistic map and the second probabilistic map, combining the aligned first and second probabilistic maps, and determining if the structural component includes a structural defect based on the combined probabilistic maps.

18 Claims, 2 Drawing Sheets

(51) Int. Cl.
*G01B 11/24* (2006.01)
*G01N 21/88* (2006.01)
*G01M 5/00* (2006.01)
*G06F 30/23* (2020.01)
*B64F 5/60* (2017.01)
*G06N 7/00* (2006.01)
*B64D 45/00* (2006.01)

(52) U.S. Cl.
CPC .......... *G01M 5/0033* (2013.01); *G01N 21/88* (2013.01); *G01N 21/8851* (2013.01); *G06F 30/23* (2020.01); *G06N 7/005* (2013.01); *G06T 7/0004* (2013.01); *B64D 2045/0085* (2013.01); *G01N 2021/8887* (2013.01); *G06T 2207/10016* (2013.01); *G06T 2207/10028* (2013.01); *G06T 2207/20076* (2013.01); *G06T 2207/20221* (2013.01); *G06T 2207/30164* (2013.01)

(58) Field of Classification Search
CPC .. G06T 2207/0028; G06T 2207/30164; G06N 7/005; G06F 17/5018; B64F 5/60; G01N 21/8851; G01N 2021/8887; G01M 5/0033; G01B 11/24
See application file for complete search history.

(56) References Cited

U.S. PATENT DOCUMENTS

| | | | |
|---|---|---|---|
| 5,087,822 | A | 2/1992 | Fairlie et al. |
| 5,257,088 | A | 10/1993 | Tyson, II et al. |
| 5,339,152 | A | 8/1994 | Horn |
| 5,481,356 | A | 1/1996 | Pouet et al. |
| 5,764,363 | A | 6/1998 | Ooki et al. |
| 6,226,080 | B1 | 5/2001 | Takeuchi et al. |
| 6,643,002 | B2 | 11/2003 | Drake, Jr. |
| 6,730,912 | B2 | 5/2004 | Sun et al. |
| 6,849,972 | B1 | 2/2005 | Barnes et al. |
| 7,209,539 | B2 | 4/2007 | De Smet |
| 7,272,254 | B2 | 9/2007 | Shankarappa et al. |
| 7,447,598 | B2 | 11/2008 | Malkin et al. |
| 7,738,730 | B2 | 6/2010 | Hawley |
| 8,131,107 | B2* | 3/2012 | Sun ................. G06K 9/6298 382/228 |
| 8,255,170 | B2 | 8/2012 | Kollgaard et al. |
| 9,488,592 | B1 | 11/2016 | Maresca et al. |
| 2004/0064269 | A1 | 4/2004 | Shibuya |
| 2005/0080572 | A1* | 4/2005 | Lin ................. G05B 19/41875 702/35 |
| 2005/0264813 | A1 | 12/2005 | Giakos |
| 2007/0223557 | A1 | 9/2007 | Pevzner et al. |
| 2007/0237399 | A1* | 10/2007 | Satonaga ............. G06K 9/4647 382/225 |
| 2009/0182528 | A1 | 7/2009 | De Groot et al. |
| 2009/0284593 | A1 | 11/2009 | Dubois et al. |
| 2009/0287450 | A1 | 11/2009 | Dubois et al. |
| 2009/0309762 | A1 | 12/2009 | Wolcken et al. |
| 2010/0013468 | A1 | 1/2010 | Joubert et al. |
| 2010/0244834 | A1 | 9/2010 | Mori et al. |
| 2011/0235894 | A1 | 9/2011 | Bookout et al. |
| 2012/0033707 | A1* | 2/2012 | Sloan ................. G01N 25/04 374/102 |
| 2012/0131309 | A1 | 5/2012 | Johnson |
| 2013/0261876 | A1 | 10/2013 | Froom et al. |
| 2013/0289943 | A1 | 10/2013 | Sharp et al. |
| 2013/0329011 | A1* | 12/2013 | Lee ................. G06T 17/00 348/46 |
| 2014/0001076 | A1 | 1/2014 | Fadeev et al. |
| 2014/0114563 | A1 | 4/2014 | Newson et al. |
| 2014/0184786 | A1 | 7/2014 | Georgeson et al. |
| 2015/0086083 | A1 | 3/2015 | Chaudhry et al. |
| 2016/0284018 | A1* | 9/2016 | Adeyoola ............ G06T 19/006 |
| 2017/0124781 | A1* | 5/2017 | Douillard ................. B60Q 1/26 |
| 2017/0248963 | A1* | 8/2017 | Levinson ................. G01C 21/32 |
| 2018/0114092 | A1* | 4/2018 | Huang ................. G06K 9/6212 |
| 2018/0276810 | A1* | 9/2018 | Wang ..................... G01B 11/24 |

OTHER PUBLICATIONS

D.G. Lowe Object recognition from local scale-invariant features. In (Proceedings of the International Conference on Computer Vision), Mar. 1993 p. 11501157.

D.W. Heoppner Federal Aviation Administration, (The role of fretting fatigue on aircraft rivet hole cracking). Office of Aviation Research, 1996. pp. 1-80.

E. Candes et al Robust principal component analysis? (Journal of the ACM), May 2011. 2, 4 58 (3), pp. 1-39.

EP Extended European Search Report; Communication; Application No. 14849153.3-1906/3049793 PCT/US2014057194; dated May 29, 2017, pp. 1-10.

H. Nguyen et al Crack image extraction using a radial basis functions based level set interpolation technique. (In ICESEE), Feb. 2012 pp. 118-122.

Hongcheng Wang, et al., "A Context-Driven Approach to Image-Based Crack Detection," Machine Vision and Applications, Oct. 2016, vol. 27, Issue 7, pp. 1103-1114.

International Search Report for application PCT/US14/57194, dated Dec. 16, 2014, 8 pages.

J. Lllingworth et al Survey of the hough transform. (Computer Vision, Graphics, and Image Processing, 44(1):87-116, 1988 2.

Jahanshahi et al An innovative methodolgy for detection and quantification of crack through incorporation of depth (Machine Vision and Applications, Feb. 2013, 2 2 (2):227-241.

Jindrich Finda, Andrew Vechart and Radek Hedl, Prediction of Fatigue Crack Growth in Airframe Structures, Jun. 6, 2012, Honeywell International Inc., 1985 Douglas Drive North (M/S MN10-112B), Golden Valley, MN 55422, USA, pp. 1-7.

M. Seigel et al Enhanced remote visual inspection of aircraft skin. In Intelligent NDE Sciences for Aging and Futuristic Aircraft), 2, 4 1997, pp. 1-12.

National Research Council Canada, [online]; [retrieved on Jul. 6, 2017]; retrived from the InternetNRCC, "Department Performance Report (DRP) Dec. 2011 Quick Links," NRC Government of Canada, pp. 1-32. http://www.nrc-cnrc.gc.ca/eng/reports/2011_2012/dpr_2012/dpr_supplementary.html.

Notification of Transmittal of the International Search Report for International Application No. PCT/US16/12959; International Filing Date: Jan. 12, 2016; dated Mar. 28, 2016; 11 pages.

P. Gunatilake et al Image understanding algorithms for remote visual inspection of aircraft surfaces. (In Machine Vision Applications in Industrial Inspection V,) Feb. 1997. 2,4 pp. 2-13 vol. 3029.

P.S. Huang, et al., "Quantitative Evaulation of Corrosion by a Digital Fringe Projection Technique," Optics and Lasers in Engineering 31 (1999) pp. 371-380.

Q. Zou, et al., "CrackTree: Automatic Crack Detection from Pavement Images," Pattern Recognition Letters, 33 (2012), pp. 227-238.

R. Mumtaz et al Computer aided visual inspection of aircraft surfaces. (International Journal of Image Processing)(IJIP), 6(1):38-553, 2012. 2.

R.O. Gordon 43-204—Visual Inspection for Aircraft. AFS-350, U.S. Department of Transportation, 1997, pp. 1-248.

S. Chambon et al Automatic road pavement assessment with image processing: Review and comparison. (International Journal of Geophysics), Feb. 2011 pp. 1-28.

T.M. Strat. Employing contextual information in computer vision. (In ARPA Image Understanding Workshop), 1993, pp. 1-13.

Written Opinion for application PCT/US14/57194, dated Dec. 16, 2014, 6 pages.

Written Opinion of the International Searching Authority for International Application No. PCT/US16/12959; International Filing Date: Jan. 12, 2016; dated Mar. 28, 2016; 5 pages.

X. Wang, "Automated Crack Detection for Digital Radiography Aircraft Wing Inspection," Research in Nondestructive Evaluation, Mar. 24, 2011, pp. 1-24.

(56) References Cited

OTHER PUBLICATIONS

Z. Lin et al The augmated lagrange multiplier method for exact recovery of corrupted low-rank matrices.( UIUC Technical Report) UILU-ENG-09-2214, May 2010, pp. 1-23.
Zhengdong Zang, et al., "TILT: Transform Invariant Low-Rank Textures," Network and Parallel Computing; Nov. 8, 2010, pp. 314-328.
PCT International Preliminary Report on Patentability; International Application No. PCT/US2014/057194; International Filing Date: Sep. 24, 2014; dated Mar. 29, 2016; pp. 1-7.
PCT, International Preliminary Report on Patentability, International Application No. PCT/US2016/012959; International Filing Date: Jan. 12, 2016; dated Jul. 18, 2017; pp. 1-6.
Extended European Serach Report issued in Application No. 16737696 dated Jun. 6, 2018, 11 pages.
John C. Aldrin, "Overview of Mathematical Modeling in Nondestructive Evaluation (NDE)", Sep. 1, 2002, 41 pages.
N. Brierley et al., "Data fusion for automated non-destructive inspection" Proceedings of the Royal Society, vol. 470, No. 2167, May 14, 2014, 25 pages.
R. Osegueda, "(U)(HBCU/MI) Workshop on Intelligent NDE Sciencies for Aging and Futuristic Aircrafts," Fast Center for Structural Integrity of Aerospace Systems, Mar. 1998, pp. 1-310 (in three parts).

\* cited by examiner

STRUCTURAL HEALTH MONITORING EMPLOYING PHYSICS MODELS

CROSS REFERENCE TO RELATED APPLICATIONS

This application is a National Stage application of PCT/US2016/012959, filed Jan. 12, 2016, which claims the benefit of U.S. Provisional Application No. 62/102,634, filed Jan. 13, 2015, both of which are incorporated by reference in their entirety herein.

BACKGROUND OF THE INVENTION

The embodiments herein generally relate to structural health monitoring and more particularly to employing physics models for structural hot spot monitoring.

Often in aircraft structures, damage may be observed in certain areas as a result of wear, tear, fatigue, etc. These areas are often referred to as "hot spots" which may be inaccessible or hidden behind other structures or panels. Once identified, there is an interest in monitoring any damage/defects and the rate of damage/defect growth so as to enable appropriate maintenance action accordingly.

Non-destructive inspection has been widely used in aerospace industry for detecting defects in aircraft surface and sub-surface structures. Over 80 percent of inspections are visual inspections because it is an economical and quick way to obtain an early assessment of the condition of an aircraft and its components. This may involve visual inspection by a technician or inspector or may be computerized and/or automated.

One form of visual inspection of hot spots is by onboard or remote monitoring with a compact self-contained camera which may have a wired or wireless connection to a computer or similar device. For remote monitoring, the camera can take a picture at requisite times or intervals and transmit the image to an outside analysis station for automated damage detection and assessment. The same automated process may be performed onboard with other notification means when damage is detected, such as onboard indicators, etc. The damage may be detected from a single image or may be detected by reference to previously obtained image(s). With an image of a hot spot available every flight or couple of flights, the hot spot can be effectively monitored for the appearance of damage and/or growth of damage such that a maintenance action can be taken at an appropriate time while guaranteeing the safety of the aircraft structure.

By removing the human-factor (technician/inspector) from the inspection process, there is an increased efficiency of inspection and monitoring of remote, difficult to reach, and/or inaccessible areas. Use of a camera and the subsequent image processing does not suffer from human limitations such as fatigue, limited memory, and an inability to exactly quantify damage. The removal of the human from the process thus makes the process more robust and repeatable.

BRIEF DESCRIPTION OF THE INVENTION

According to one embodiment, a method for detecting structural defects is provided. The method includes generating a first probabilistic map of a critical location of a structural component based on a physics model of the critical location and capturing data of the critical location. The method also includes generating a second probabilistic map based on an analysis of the captured data of the critical location, aligning the first probabilistic map and the second probabilistic map, combining the aligned first and second probabilistic maps, and determining if the structural component includes a structural defect based on the combined probabilistic maps.

In addition to one or more of the features described above or below, or as an alternative, further embodiments could include, wherein the physics model is a Finite Element Analysis model.

In addition to one or more of the features described above or below, or as an alternative, further embodiments could include, wherein the captured data comprises at least one of a 2D image, a plurality of 2D images, a video, and a 3D point cloud.

In addition to one or more of the features described above or below, or as an alternative, further embodiments could include, wherein the step of aligning is based on a transformation obtained by model transformation between at least one of (i) the captured data and a geometric model of the critical location, (ii) the captured data and the physics model, and (iii) the first and second probabilistic maps.

In addition to one or more of the features described above or below, or as an alternative, further embodiments could include, wherein the two probabilistic maps are combined based on a Bayesian method.

In addition to one or more of the features described above or below, or as an alternative, further embodiments could include rejecting false detections of structural defect based on the combined probabilistic maps.

In addition to one or more of the features described above or below, or as an alternative, further embodiments could include the step of providing an alarm if a structural defect is determined to exist.

In addition to one or more of the features described above or below, or as an alternative, further embodiments could include, wherein the structural component is a component of an aircraft.

In addition to one or more of the features described above or below, or as an alternative, further embodiments could include, wherein the determining step comprises analyzing values of the combined probabilistic maps.

According to another embodiment, a system for detecting a structural defect is provided. The system includes an image processing computer including a processor and memory, the memory having at least one physics model of a critical location of a structural component stored therein, and a camera configured to capture data of the critical location, wherein the memory includes instructions stored thereon that, when executed by the processor, cause the system to generate a first probabilistic map of the critical location based on the physics model of the critical location, generate a second probabilistic map based on the data captured by the camera, align the first probabilistic map and the second probabilistic map, combine the aligned first and second probabilistic maps, and determine if the structural component includes a structural defect based on the combined probabilistic maps.

In addition to one or more of the features described above or below, or as an alternative, further embodiments could include, wherein the physical model is a Finite Element Analysis model.

In addition to one or more of the features described above or below, or as an alternative, further embodiments could include, wherein the camera is configured to capture at least one of a 2D image, a plurality of 2D images, a video, and a 3D point cloud.

In addition to one or more of the features described above or below, or as an alternative, further embodiments could include, wherein the step of aligning is based on a transformation obtained by model transformation between at least one of (i) the captured data and a geometric model of the critical location, (ii) the captured data and the physics model, and (iii) the first and second probabilistic maps.

In addition to one or more of the features described above or below, or as an alternative, further embodiments could include, wherein the two probabilistic maps are combined based on a Bayesian method.

In addition to one or more of the features described above or below, or as an alternative, further embodiments could include, wherein the structural component is a component of an aircraft.

In addition to one or more of the features described above or below, or as an alternative, further embodiments could include an alarm configured to alert when a structural defect is determined to exist.

Technical effects of embodiments of the invention include providing robust defect detection and determination of defects present in structural components. Further, other technical effects of embodiments of the invention include the ability to efficiently remove, reduce, and/or eliminate false alarms of defects.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION OF THE INVENTION

Figure 1:
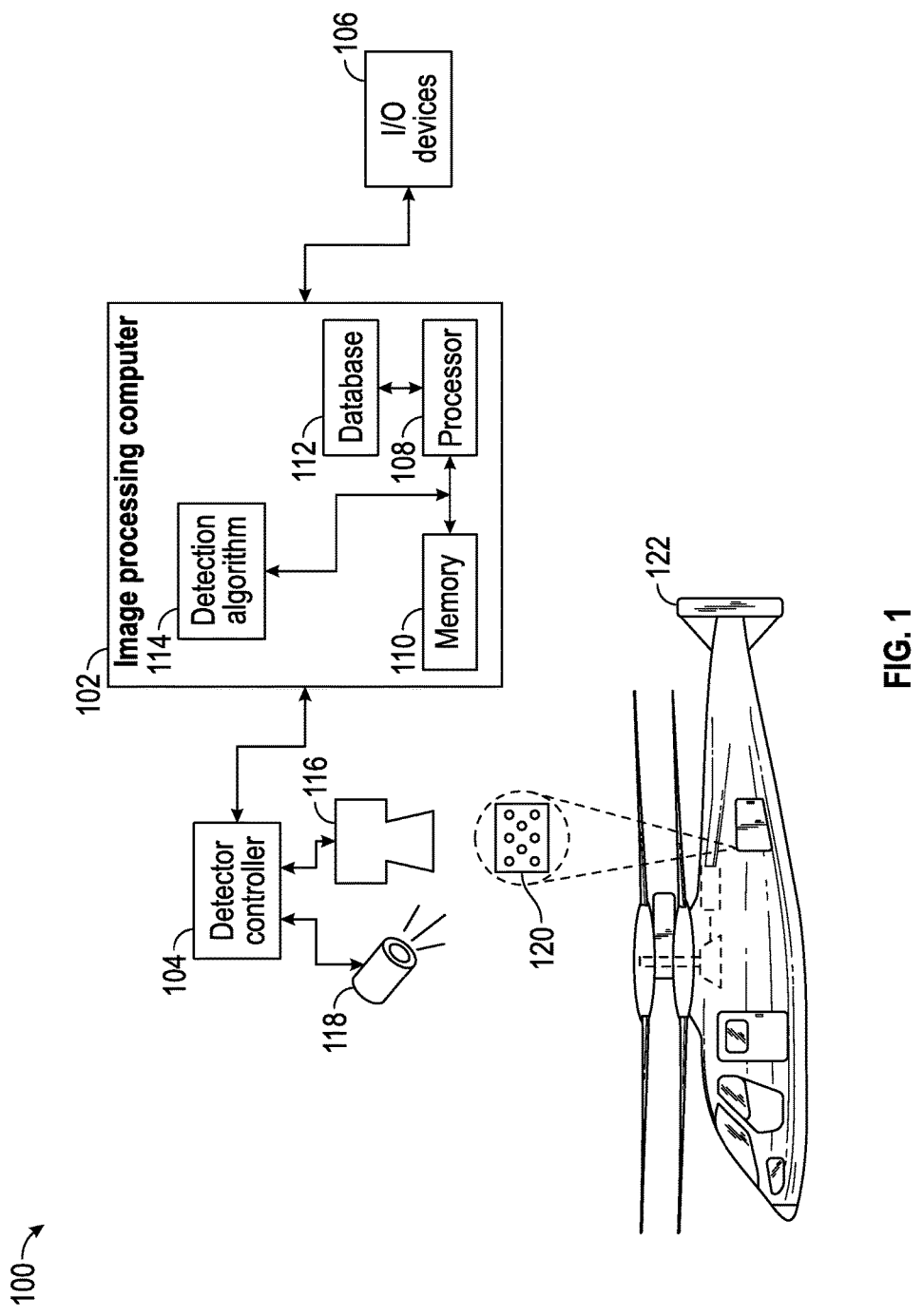
FIG. 1 is a schematic view of an exemplary structural hot spot and critical location monitoring system according to an embodiment of the invention.

Referring to the drawings, FIG. 1 illustrates a schematic block diagram of a structural hot spot and critical location monitoring system 100 (hereinafter "structural monitoring system 100") according to an exemplary embodiment of the invention. The structural monitoring system 100 includes a defect detection and monitoring algorithm 114 (hereinafter "detection algorithm 114") for detecting defects or hot spots in a structural component 120 in, for example, a rotary-wing aircraft 122.

As illustrated, the structural monitoring system 100 includes an image processing computer 102, a detector controller 104, and input/output (I/O) devices 106. The image processing computer 102 may be implemented as a workstation, such as a computer, a server, dedicated monitoring device, or other similar processing configuration, or may be implemented as a portable processing device, such as a tablet, laptop, etc. The image processing computer 102 includes one or more memory components 110 that communicate with a processor 108. The memory 110 may store the detection algorithm 114 as executable instructions that are executed by the processor 108. The executable instructions may be stored or organized in any manner and at any level of abstraction, such as in connection with the execution of the detection algorithm 114. In some embodiments, memory 110 may include random access memory (RAM), read only memory (ROM), volatile or non-volatile memory, or other electronic, optical, magnetic, or any other computer readable medium onto which is stored the detection algorithm 114 described below.

The processor 108, or image processing computer 102, may be any type of processor (CPU), including a general purpose processor, a digital signal processor, a microcontroller, an application specific integrated circuit, a field programmable gate array, or the like. In some embodiments, the processor 108 may include an image processor in order to process, through the use of additional processing algorithms, video and/or still image data that are captured by a camera 116. The image processing computer 102 may include a database 112 in data communication with the processor 108, and in some embodiments the database 112 may be stored in memory 110. The database 112 may be used to store image and video data of the structural component 120 as well as any other data and algorithms that may be used to implement the detection algorithm 114. Although this invention has been disclosed in embodiments as being applied to a rotary-wing aircraft 122, it is to be appreciated that the embodiments described herein may be applied to other vehicles or structures for which defect identification is of concern.

As shown, structural monitoring system 100 includes a detector controller 104 in two-way communication with the image processing computer 102. The detector controller 104 is in data and/or electrical communication with, for example, a plurality of light emitting diodes (LEDs) 118 and the camera 116 over a wired or wireless connection. In some embodiments, camera 116 may be a two-dimensional (2D) or three-dimensional (3D) camera configured to capture 2D images, a plurality of 2D images, videos, 3D point clouds, etc. The camera 116 includes an illumination source, e.g., a built-in plurality of LEDs 118 and detector controller 104, thus forming a single device configuration. In other embodiments, the camera 116 may be remote from detector controller 104 and/or the plurality of LEDs 118. For example, in a non-limiting example, camera 116 is a three color RGB camera with a 120 degree field of view and may include a plurality of LEDs built into the housing of the camera 116, may include a resolution of 1 millimeter at 3 meters, may include a range of 2 centimeters to 3 meters, may include on-board image processing to interface with detector controller 104 or with image processing computer 102, and may include wireless capability to transmit images to a remote processor. In one example, the remote processor may be processor 108. In some embodiments, a polarizer may be coupled to camera 116 in order to remove specular reflections from images received by camera 116. In some embodiments, an infrared camera coupled to an infrared illuminator, or other detector, may be used in combination with camera 116 or in lieu of camera 116. Further, those of skill in the art will appreciate that other types of imaging devices and/or spectral wavelengths for imaging may be used without departing from the scope of the invention.

As used herein, the terms "sensor," "camera," and "video" are used generically for any 2D or 3D (depth) sensing device. As used herein, the term "image" is used generally for any 2D or 3D data or data array, such as 2D image(s), videos, 3D point clouds, etc. As will be appreciated by those of ordinary skill in the art, there are multiple depth sensing technologies including, but not limited to, structured light, phase shift, time of flight, stereo triangulation, sheet of light triangulation, light field cameras, coded aperture cameras, computational imaging techniques like depth from defocus, structure from motion (SFM), simultaneous localization and mapping (SLAM), imaging radar, imaging sonar, scanning LIDAR, flash LIDAR, etc. Different technologies may be active or passive and are operable in various bands of the electromagnetic or acoustic spectrum.

There are both qualitative and quantitative differences between conventional 2D imaging and 3D depth sensing which make depth sensing preferable in some applications. In 2D imaging, the reflected color (mixture of wavelengths) from a first object in each radial direction from the camera is captured in an image. The image, then, is the combined spectrum of the source illumination and the spectral reflectivity of objects in the scene. In 3D depth sensing there is no color (spectral) information. Rather, the distance (depth, range) to a first reflective object in each radial direction from the camera is captured. Most 3D technologies may have inherent limits on the maximum detectable range (often quite short range) and are of much lower spatial resolution than typical 2D cameras.

In some embodiments, the detector controller 104 may include memory and a processor that respectively store and process instructions for, in some examples, controlling the positioning and modulation of a light beam directed from the plurality of LEDs 118 toward an inspection point or critical location. Each of the plurality of LEDs 118 may be coupled to a polarizer in order to remove specular reflections in the image data of the critical location on a surface of the structural component 120 being illuminated. In some embodiments, each LED 118, whether grouped or individually, may be directed and/or controlled by detector controller 104 to be selectively turned ON/OFF to illuminate a critical location of the structural component 120 while camera 116 is capturing an image or video of the critical location. In some embodiments, the LEDs 118 may be selectively and remotely controlled by image processing computer 102 through direction by a user via wired or wireless signals sent from image processing computer 102 or I/O devices 106, or automatically controlled/directed by instruction from the image processing computer 102.

In an exemplary configuration, the plurality of LEDs 118 may be placed substantially around rivet locations of interest (generally "element of interest") to provide directional illumination, and obtain a set of images through user input or by the application of detection algorithm 114. In some embodiments, the LEDs 118 may be modulated so that one or more of the plurality of LEDs 118 may be individually and/or selectively turned ON/OFF. In this way, the system may provide for capturing optimal images for processing. The processor of detector controller 104 may be any type of processor (CPU), including a graphics processing unit (GPU), a general purpose processor, a digital signal processor, a microcontroller, an application specific integrated circuit, a field programmable gate array, or the like. Also, memory on detector controller 104 may include random access memory (RAM), read only memory (ROM), volatile or non-volatile memory, or other storage such as an electronic, an optical, a magnetic, or any other computer readable medium. It is to be appreciated that the detection algorithm 114 may also be utilized for detecting defects in critical locations utilizing other fasteners besides rivets, or for other structural features that may suffer from wear, fatigue, damage, etc., even if not related to fasteners.

Image processing computer 102 may provide one or more directives to detector controller 104 such as, for example, positioning the plurality of LEDs 118, turning ON/OFF the plurality of LEDs 118, and/or changing a direction of the plurality of LEDs 118 in response to camera image data that is acquired by camera 116 for structural component 120. Directives provided by the image processing computer 102 may be received from one or more input/output (I/O) devices 106, or may be automated based on programming, etc. The I/O devices 106 may include a display device or screen, audio speakers, a graphical user interface (GUI), keyboard, microphone for voice recognition, etc. In some embodiments, the I/O devices 106 may be used to enter or adjust a linking between data or sets of data.

It is to be appreciated that structural monitoring system 100 is illustrative. In some embodiments, additional components or entities not shown in FIG. 1 may be included. Further, in some embodiments, one or more of the components or entities in FIG. 1 may be optional and/or omitted. In some embodiments, the components or entities of structural monitoring system 100 may be arranged or configured differently from what is shown in FIG. 1. For example, in some embodiments, the detector controller 104 may be commanded by I/O device 106, as opposed to being commanded by processor 108 or image processing computer 102 as shown in FIG. 1.

Automated image analysis for defect detection, using the above described structural monitoring system 100, may be a challenging task to perform and provide robust results based on automated analysis, i.e., automated visual inspection of images. For example, due to variations in lighting, viewpoint, possible surface scratches and stains, and other factors, the automated analysis method may result in false alarms. Similar to human inspection, automated visual analysis relies on visual images of a surface or area, which thus can lead to false alarms and may require a human analysis of the area in the event of the alarm to confirm the existence of a defect and the status thereof.

Accordingly, in accordance with embodiments of the invention, the detection algorithm 114 includes analysis and/or comparison based on one or more physical models of the structure of the hot spot location. For example, a Finite Element Analysis ("FEA"), or similar physical modeling, that is generated during the engineering phase of design and construction of a structural component may be used as a form of comparison or guide in order to accurately determine the structural health of the component and any defects that exist in the component. The FEA and related information can be loaded into or stored within the memory 110 and/or database 112 of the image processing computer 102. The structural monitoring system 100 may then use both (i) data of visual imaging of a structural hot spot area and (ii) a physical model of the structural hot spot area to obtain robust and accurate monitoring of defects in a structural component. Although described herein as using an FEA physics model, those of skill in the art will appreciate that other types of physics models may be used without departing from the scope of the invention.

Figure 2:
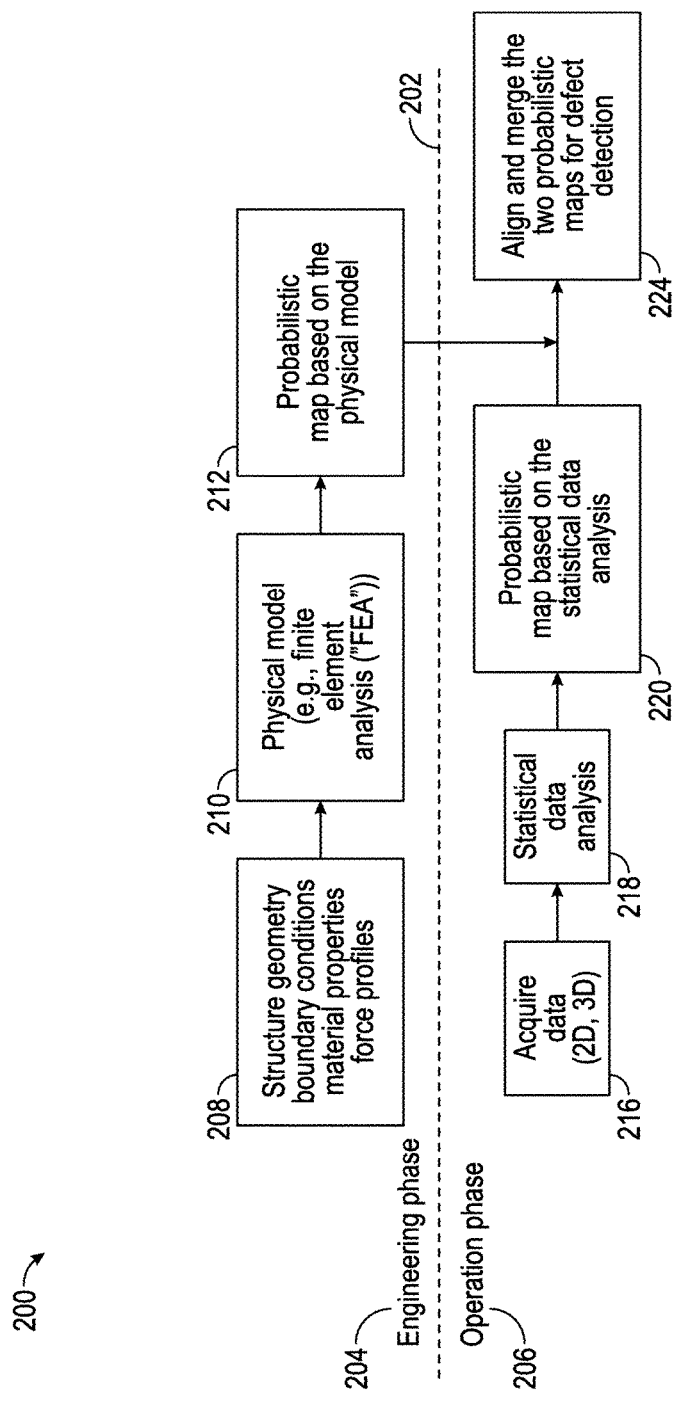
FIG. 2 is an illustrative flow chart of a process of defect detection in accordance with an exemplary embodiment of the invention.

Turning now to FIG. 2, an illustrative diagram of an exemplary process 200 of the invention is shown. The process 200 is a combination of two phases. The line 202 divides the two phases into an engineering phase 204 that is above line 202 in FIG. 2 and an operation phase 206 that is below line 202.

During the engineering phase 204, the physics or physical models of structures are leveraged. For example, a Finite Element Analysis (FEA) model is usually available in the engineering of structural design for a component or may be created after construction/design as needed or necessary. Associated with and incorporated into the FEA are the load profiles, material properties, and geometric designs that are used for displacement, stress, and strain analysis. The information includes, for example, structural geometry, material properties, boundary conditions, and force profiles which are all modeled at step 208. This information is processed into a physical model, such as an FEA, at step 210. The FEA can then be used to generate a first probabilistic map of crack occurrences based on the modeling at step 212. The map generated at step 212 may be referred to as a physics map, a modeling map, an FEA map, or similar name, but under any nomenclature, the map generated at step 212 is based on the physical models generated at step 210.

A probabilistic map is a numerical map where probabilities are mapped to locations of a related structure. Thus, at each spatial location of the structure, a probability value may be associated therewith, for example, to indicate the likelihood of a structural defect forming. The probability is based, at least in part, on the forces, stresses, and other structural factors that are considered during engineering design and modeling of components. For purposes of embodiments of this invention, in some cases, the map may be normalized to form a map of values ranging between zero and one (0→1). For example, values closer to zero may indicate a low probability of defects forming at the location of the value, as mapped to the physical structure of the component, and a value closer to one may indicate a high probability of a defect forming at that location.

In the first probabilistic map generated at step 212, in large stress areas (high values on the first probabilistic map), cracks or defects are more likely to occur, and in small stress areas (low values on the first probabilistic map), cracks or defects are less likely to occur. The first probabilistic map generated at step 212 is based on the FEA modeling and is used to predict and/or confirm, in part, the location and/or existence of damage to a component. As the engineering phase 204 is complete prior to real-world construction, the first probabilistic map of step 212 may pre-exist and thus may be pre-loaded or stored in an image processing computer or similar device. Accordingly, a representation and/or mathematical representation similar to first probabilistic map of step 212 may be embedded into the software of the image processing computer or other similar device. Advantageously, as the modeling is completed during the engineering phase 204, this aspect is non-recurring, and the information is substantially static and does not change over time in many cases. Thus, the physical modeling and associated probabilistic map provides a baseline, guideline, and/or reference point to compare against. However, in some cases, the probabilistic map can be updated if the engineering conditions change after deployment, or for any other reason.

The operation phase 206 is carried out in situ by a structural monitoring system such as system 100 of FIG. 1. Using an imaging device, the structural monitoring system acquires images and/or data of the hot spot area that is of concern and monitored at step 216. The images and/or data acquired at step 216 may be 2D and/or 3D images and/or data. For example, implementation of a visual detection algorithm begins with low-level image processing by identifying or determining a critical location of a structural component to be monitored. In some embodiments, this may be determined based in part on the physical model created during the engineering phase 204. In some embodiments, identification or determination of a critical location may be done before placing and/or installing a system such as that shown in FIG. 1.

As such, a critical location may be pre-determined based on analytical modeling (such as the physical modeling of engineering phase 204), experiential and/or experimental information, and/or based on historical information regarding the occurrence of hot spots. For example, hot spots are known to be associated with rivet or other fastener locations. Through experience and analysis, it has been determined that structural areas that have load transfer from one structural member to another structural member experience metal fatigue and display hot spots or cracks over time. These areas may include critical locations with repetitive shapes such as, for example, one or more fasteners or other structural locations with repetitive shapes. As such, cracks are likely to occur around fasteners at these critical locations that have one or more fasteners, e.g., in a gusset plate and, accordingly, a visual detection algorithm may be programmed to direct a camera to target these locations. Further, the camera may be programmed to identify, in some embodiments, repetitive fasteners or alternatively, be programmed to a particular coordinate location of the structural component based on prior knowledge of the structural component.

Based on this information, at step 216, one or more camera images are obtained. Referring again to FIG. 1, as an example, signals indicative for at least one camera image for a critical location are received by camera 116. In some embodiments, camera 116 may take a still camera image, and in other embodiments multiple still images may be captured or a video may be captured. In some embodiments, the imaging may occur at predetermined times and/or intervals. As discussed above, in some embodiments, a critical location may represent at least one image of one or multiple fasteners acquired through the wide field of view camera 116. The at least one camera image for the fasteners is received by detector controller 104 which transmits the camera image to image processing computer 102 for analysis of the critical location, i.e., crack detection or structural deformation. In some embodiments, crack detection may be detected, in part, from a single or multiple camera images or, alternatively, by reference of a camera image to a previous camera image or images of the same critical location (i.e., reference to historical camera image(s)). In some embodiments, camera 116 may be panned to capture multiple images or a video of a wider monitoring area. The acquired images may be directly used for crack detection, or alternatively, initially stitched to generate a panoramic image before transmitting the panoramic image to the image processing computer 102 for analysis.

Once the image(s) for analysis are obtained at step 216, statistical image and/or data analysis, using known techniques, is then applied at step 218 and a second probabilistic map of crack occurrence is generated at step 220. In step 218, signals indicative of the camera image or data are received by an image processing computer. The camera images or data are processed by a processor in order to detect the structural component of interest for hot spot detection, such as at the fasteners. The camera image or data is processed by implementing known algorithms to identify shapes in the image, such as the one or more fasteners. The algorithm may, for example, identify circles of the one or multiple fasteners. The circles may then be analyzed for defect detection, as known in the art. For example, an image of a plurality of rivets in a structural component may be taken at step 216. In some examples, after the multiple rivets are detected, the regions around each rivet may be cropped, producing sub-images, and represented in a large input matrix.

The information obtained from image or data acquired at step 216 and the data generated at step 218 during the statistical data analysis is then used to generate a second probabilistic map based on the statistical image analysis at step 220. The second probabilistic map generated at step 220 may identify cracks or data indicative of damage or similar structural defects in the real-world observed component. The second probabilistic map generated at step 220 is a representation of the real-world image analysis from steps 216 and 218 and is used to predict, in part, the location and/or existence of damage to a component. The second probabilistic map generated at step 220 may be normalized similar to the first probabilistic map.

The two probabilistic maps generated at steps 212 and 220, from the engineering phase 204 and from the operation phase 206, respectively, are then aligned and merged at step 224 to make the final decision as to whether there is a structural defect or damage, such as a crack. Because the FEA analysis of a component requires the geometry and load profiles during the design stage, the structural geometry and load profile in image-based crack detection can be compared to obtain robust results and, further, can reject false detections based on stress analysis and image features.

During alignment of the two probabilistic maps at step 224, the mathematical representation from the FEA map from step 212 must be overlaid and/or aligned with the real-world image-based map from step 220. For example, the transformation for alignment can be obtained by model transformation between images and geometric model (e.g., CAD model) of the structure, between the images and the FEA model, and/or between the two probabilistic maps. By doing so, false alarms may be reduced or eliminated because a component may be monitored for failures in the locations or areas where stress is most likely to occur, and false alarms based on merely surficial scratches, dents, etc. may be ignored during the detection phase. Although based on images and representations in the above description, those skilled in the art will appreciate that the analysis, mapping, alignment, and comparison can all be completed mathematically or computationally, without the generation of an actual image other than the original hot spot image taken at step 216.

During or after step 224, a determination is made as to whether the structural component includes a defect. To make this determination, in some embodiments, the normalized probabilistic maps generated at steps 212 and 220 are combined, merged, and compared. For example, a comparison is made between the normalized values of the probabilistic maps generated at steps 212 and 220. If the visual map presents a high value in a location where the physics map indicates a very low probability (low value) of defect, it may be concluded that the potential defect is a false alarm, e.g., a surficial scratch or dent may be at the location of the potential defect. Similarly, if the visual map presents a high value in a location where the physics map indicates a high probability (high value), then it is likely that the defect is real and an alarm may be provided. Accordingly, in some embodiments, a comparison of the normalized and aligned values may be compared in order to eliminate false alarms. In other embodiments, the two maps may be combined (added, subtracted, fused, etc.) to create a new map showing where the largest variances and similarities are present, thus indicating where false alarms may be present and where real defects may exist. For example, one method may be a Bayesian based method.

Advantageously, embodiments of the invention provide systems and techniques for identifying structural defects in components. Further, embodiments of the invention provide robust results, including the ability to eliminate false alarms. Thus, a high confidence and accuracy may be provided by various embodiments of the invention.

While the invention has been described in detail in connection with only a limited number of embodiments, it should be readily understood that the invention is not limited to such disclosed embodiments. Rather, the invention can be modified to incorporate any number of variations, alterations, substitutions, combination, sub-combination, or equivalent arrangements not heretofore described, but which are commensurate with the spirit and scope of the invention. Additionally, while various embodiments of the invention have been described, it is to be understood that aspects of the invention may include only some of the described embodiments.

For example, in the system, as shown in FIG. 1, various components, elements, and features may be combined, eliminated, or configured differently including adding additional features, as required or desired for specific applications, and thus FIG. 1 is merely presented for explanatory purposes and is a non-limiting example of a configuration that embodies the invention. Further, with respect to the process described with respect to FIG. 2, various steps may be combined/or omitted without departing from the invention, or additional steps may be performed without departing from the scope of the invention.

Accordingly, the invention is not to be seen as limited by the foregoing description, but is only limited by the scope of the appended claims.

What is claimed is:

1. A method for detecting structural defects comprising:
    acquiring a physics model of a structural component, the physics model based on geometric properties of the structural component and expected forces on the structural component during operation of the structural component;
    generating a first probabilistic map of a critical location of a structural component based on the physics model;
    capturing image data of the critical location;
    generating a second probabilistic map based on an analysis of the captured image data of the critical location;
    aligning the first probabilistic map and the second probabilistic map;
    combining the aligned first and second probabilistic maps; and
    determining if the structural component includes a structural defect based on the combined probabilistic maps.

2. The method of claim 1, wherein the physics model is a Finite Element Analysis model.

3. The method of claim 1, wherein the captured data comprises at least one of a 2D image, a plurality of 2D images, a video, and a 3D point cloud.

4. The method of claim 1, wherein the step of aligning is based on a transformation obtained by model transformation between at least one of (i) the captured data and a geometric model of the critical location, (ii) the captured data and the physics model, and (iii) the first and second probabilistic maps.

5. The method of claim 1, wherein the two probabilistic maps are combined based on a Bayesian method.

6. The method of claim 1, further comprising rejecting false detections of structural defect based on the combined probabilistic maps.

7. The method of claim 1, further comprising the step of providing an alarm if a structural defect is determined to exist.

8. The method of claim 1, wherein the structural component is a component of an aircraft.

9. The method of claim 1, wherein the determining step comprises analyzing values of the combined probabilistic maps.

10. The method of claim 1, further comprising identifying the critical location based on the physics model.

11. A system for detecting a structural defect defining:
an image processing computer including a processor and memory, the memory having at least one physics model of a structural component stored therein, the physics model based on geometric properties of the structural component and expected forces on the structural component during operation of the structural component;
a camera configured to capture data of the critical location;
wherein the memory includes instructions stored thereon that, when executed by the processor, cause the system to:
generate a first probabilistic map of the critical location based on the physics model;
generate a second probabilistic map based on data captured by the camera;
align the first probabilistic map and the second probabilistic map;
combine the aligned first and second probabilistic maps; and
determine if the structural component includes a structural defect based on the combined probabilistic maps.

12. The system of claim 11, wherein the physical model is a Finite Element Analysis model.

13. The system of claim 11, wherein the camera is configured to capture at least one of a 2D image, a plurality of 2D images, a video, and a 3D point cloud.

14. The system of claim 11, wherein the step of aligning is based on a transformation obtained by model transformation between at least one of (i) the captured data and a geometric model of the critical location, (ii) the captured data and the physics model, and (iii) the first and second probabilistic maps.

15. The system of claim 11, wherein the two probabilistic maps are combined based on a Bayesian method.

16. The system of claim 11, wherein the structural component is a component of an aircraft.

17. The system of claim 11, further comprising an alarm configured to alert when a structural defect is determined to exist.

18. The system of claim 11, wherein the processor is configured to identify the critical location based on the physics model.

* * * * *